United States Patent
Tsukamoto et al.

(10) Patent No.: US 9,966,550 B2
(45) Date of Patent: May 8, 2018

(54) ORGANIC ELECTROLUMINESCENT ELEMENT AND ORGANIC ELECTROLUMINESCENT PANEL

(71) Applicant: Sharp Kabushiki Kaisha, Sakai-shi, Osaka (JP)

(72) Inventors: Yuto Tsukamoto, Sakai (JP); Katsuhiro Kikuchi, Sakai (JP); Shinichi Kawato, Sakai (JP); Hideki Uchida, Sakai (JP); Manabu Niboshi, Sakai (JP); Satoshi Inoue, Sakai (JP); Yoshiyuki Isomura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 38 days.

(21) Appl. No.: 15/117,771

(22) PCT Filed: Feb. 10, 2015

(86) PCT No.: PCT/JP2015/053574
§ 371 (c)(1),
(2) Date: Aug. 10, 2016

(87) PCT Pub. No.: WO2015/125653
PCT Pub. Date: Aug. 27, 2015

(65) Prior Publication Data
US 2016/0359128 A1     Dec. 8, 2016

(30) Foreign Application Priority Data

Feb. 18, 2014   (JP) ................................. 2014-028778

(51) Int. Cl.
*H01L 51/50*     (2006.01)
*H01L 27/32*     (2006.01)
(Continued)

(52) U.S. Cl.
CPC ...... *H01L 51/5008* (2013.01); *H01L 27/3211* (2013.01); *H01L 51/504* (2013.01);
(Continued)

(58) Field of Classification Search
CPC ............. H01L 51/5008; H01L 27/3211; H01L 51/5004; H01L 51/5024; H01L 51/504;
(Continued)

(56) References Cited

U.S. PATENT DOCUMENTS

| 7,776,456 B2 | 8/2010 | D'Andrade et al. |
| 2006/0011908 A1* | 1/2006 | Ohsawa .............. H01L 51/0085 257/40 |

(Continued)

FOREIGN PATENT DOCUMENTS

| JP | 2008-511100 A | 4/2008 |
| JP | 2009-048893 A | 3/2009 |

(Continued)

OTHER PUBLICATIONS

Official Communication issued in International Patent Application No. PCT/JP2015/053574, dated Apr. 21, 2015.

*Primary Examiner* — Fernando L Toledo
*Assistant Examiner* — Neil Prasad
(74) *Attorney, Agent, or Firm* — Keating & Bennett, LLP

(57) ABSTRACT

The present invention provides an organic EL element having high luminous efficacy and productivity and an organic EL panel including the organic EL element. The organic electroluminescent element of the present invention includes, in the given order, an anode, a hole-transport layer, a luminescent unit, an electron-transport layer, and a cathode. The luminescent unit includes a mixed light-emitting layer and includes a luminescent dopant layer at least between the hole-transport layer and the mixed light-emitting layer or between the electron-transport layer and the (Continued)

mixed light-emitting layer. The mixed light-emitting layer contains a first luminescent host material and a first luminescent dopant material. The luminescent dopant layer consists essentially of a second luminescent dopant material and is thinner than the mixed light-emitting layer.

15 Claims, 4 Drawing Sheets

(51) Int. Cl.
  *H01L 51/52* (2006.01)
  *H01L 51/00* (2006.01)
(52) U.S. Cl.
  CPC ...... *H01L 51/5004* (2013.01); *H01L 51/5024* (2013.01); *H01L 51/5056* (2013.01); *H01L 51/5072* (2013.01); *H01L 51/5096* (2013.01); *H01L 51/5206* (2013.01); *H01L 51/5221* (2013.01); *H01L 51/0085* (2013.01); *H01L 2251/5384* (2013.01); *H01L 2251/552* (2013.01); *H01L 2251/558* (2013.01)
(58) Field of Classification Search
  CPC ............. H01L 51/5056; H01L 51/5072; H01L 51/5096; H01L 51/5206; H01L 51/5221; H01L 51/0085; H01L 2251/5384; H01L 2251/552; H01L 2251/558
  See application file for complete search history.

(56) References Cited

U.S. PATENT DOCUMENTS

| 2006/0040132 | A1 | 2/2006 | Liao et al. |
| 2006/0121309 | A1 | 6/2006 | D'Andrade |
| 2007/0069636 | A1* | 3/2007 | Choulis ............... H01L 51/5048 313/504 |
| 2007/0228938 | A1 | 10/2007 | Hatwar et al. |
| 2010/0314612 | A1 | 12/2010 | Lee et al. |
| 2011/0156059 | A1 | 6/2011 | Reineke et al. |
| 2012/0091436 | A1* | 4/2012 | Forrest ................... C30B 23/02 257/40 |
| 2012/0121933 | A1* | 5/2012 | Ma ...................... H01L 51/5036 428/704 |
| 2014/0084255 | A1* | 3/2014 | Jou ..................... H01L 51/5012 257/40 |
| 2014/0175392 | A1* | 6/2014 | Ku ........................ H01L 51/504 257/40 |
| 2016/0079316 | A1* | 3/2016 | Zhou ................... H01L 51/5278 257/13 |
| 2016/0322430 | A1* | 11/2016 | Kawato ............... H01L 51/5012 |

FOREIGN PATENT DOCUMENTS

| JP | 2009-532825 A | 9/2009 |
| JP | 2011-228569 A | 11/2011 |
| JP | 2012-151322 A | 8/2012 |
| TW | 201044662 A | 12/2010 |

* cited by examiner

ORGANIC ELECTROLUMINESCENT ELEMENT AND ORGANIC ELECTROLUMINESCENT PANEL

TECHNICAL FIELD

The present invention relates to organic electroluminescent elements (hereinafter, also referred to as "organic EL elements") and organic electroluminescent panels (hereinafter, also referred to as "organic EL panels"). The present invention more specifically relates to an organic EL element having a structure suitable for emitting light of different colors and an organic EL panel including the organic EL element.

BACKGROUND ART

Organic EL panels provided with organic electroluminescent elements utilizing the electroluminescence of organic materials have drawn attention in recent years. Organic EL elements emit light by recombining holes injected from the anode and electrons injected from the cathode within a light-emitting layer disposed between these electrodes. Organic EL panels are superior in terms of high contrast and low power consumption, for example, to liquid crystal display devices when used as display panels of thin profile display devices. Organic EL panels are also expected to be used in applications other than display devices, such as lighting.

In order to be used in applications such as display devices, organic EL panels need to emit light of various colors. Organic EL element structures capable of emitting white light are strongly desired. Various organic EL element structures capable of emitting white light have been proposed. For example, an element structure called a tandem mode is known in which multiple organic EL elements are stacked in the vertical direction and are driven by a single power source. In a common tandem mode, each organic EL element emits light of a primary color. Further, another tandem mode is also known in which multiple organic EL elements emitting white light are stacked (for example, see Patent Literature 1).

Other known structures include an element structure in which light-emitting layers of different colors are stacked adjacently (for example, see Patent Literature 2) and an element structure in which two or more luminescent dopant materials with different luminescence peak wavelengths are contained in a single light-emitting layer (for example, see Patent Literature 3).

CITATION LIST

Patent Literature

Patent Literature 1: JP 2008-511100 T
Patent Literature 2: JP 2009-532825 T
Patent Literature 3: JP 2011-228569 A

SUMMARY OF INVENTION

Technical Problem

FIG. 7 is a schematic cross-sectional view of one example of an organic EL panel having a conventional tandem structure. In an organic EL panel 200A shown in FIG. 7, an organic EL element 220A disposed on a substrate 210 has a structure in which an anode 222, a first hole-injection layer 223, a blue light-emitting layer 226B, a first electron-injection layer 229, an intermediate layer 231, a second hole-injection layer 223, a yellow light-emitting layer 226Y, a second electron-injection layer 229, and a cathode 230 are stacked in the given order from the substrate 210 side. A hole-transport layer may be provided between the first hole-injection layer 223 and the blue light-emitting layer 226B, and between the second hole-injection layer 223 and the yellow light-emitting layer 226Y. An electron-transport layer may be provided between the blue light-emitting layer 226B and the first electron-injection layer 229, and between the yellow light-emitting layer 226Y and the second electron-injection layer 229.

In the organic EL element 220A having a tandem structure mentioned above, the light-emitting positions are completely separated above and below the intermediate layer 231. Thus, the carriers are easily well balanced, but a material suitable for the intermediate layer 231 where the holes and the electrons are transferred is difficult to select appropriately. Such a situation causes problems such as a high driving voltage and a decrease in luminous efficacy due to loss of carriers in the intermediate layer. Further, the above structure needs twice to three times as many layers as in an element structure shown in FIG. 8 to be mentioned later, so that the productivity is poor.

FIG. 8 is a schematic cross-sectional view of one example of an organic EL panel having a conventional structure in which light-emitting layers of different colors are stacked. In an organic EL panel 200B shown in FIG. 8, an organic EL element 220B disposed on the substrate 210 has a structure in which the anode 222, the hole-injection layer 223, the blue light-emitting layer 226B, a red light-emitting layer 226R, a green light-emitting layer 226G, the electron-injection layer 229, and the cathode 230 are stacked in the given order from the substrate 210 side. A hole-transport layer may be provided between the hole-injection layer 223 and the blue light-emitting layer 226B. An electron-transport layer may be provided between the green light-emitting layer 226G and the electron-injection layer 229.

The organic EL element 220B shown in FIG. 8 has difficulty in causing the luminescent materials of the respective colors in all of the three layers, i.e., the blue light-emitting layer 226B, the red light-emitting layer 226R, and the green light-emitting layer 226G, to efficiently emit light by adjusting the light-emitting positions. Thus, the luminous efficacy of such an element is poor.

Also, in the case of an element structure in which two or more luminescent dopant materials are contained in a single light-emitting layer, such multiple luminescent dopant materials need to be co-vapor-deposited. Thus, the luminescent dopant materials are likely to be deactivated due to the interaction therebetween and the luminous efficacy becomes poor.

The present invention was made in view of the above current state of the art, and aims to provide an organic EL element having high luminous efficacy and productivity and an organic EL panel including the organic EL element.

Solution to Problem

The inventors have made various studies on methods of achieving an organic EL element having high luminous efficacy with a relatively simple structure. As a result, the inventors have found that providing a luminescent unit in which a mixed light-emitting layer and a luminescent dopant layer are stacked, with the mixed light-emitting layer containing both a luminescent host material and a luminescent dopant material and the luminescent dopant layer consisting essentially of a luminescent dopant material and being thinner than the mixed light-emitting layer, enables optimization of the structure of a region for recombination of carriers and high luminous efficacy. Thereby, the inventors have arrived at the solution to the above problems and completed the present invention.

In other words, one aspect of the present invention may be an organic electroluminescent element including in the given order an anode, a hole-transport layer, a luminescent unit, an electron-transport layer, and a cathode, the luminescent unit including a mixed light-emitting layer and including a luminescent dopant layer at least between the hole-transport layer and the mixed light-emitting layer or between the electron-transport layer and the mixed light-emitting layer, the mixed light-emitting layer containing a first luminescent host material and a first luminescent dopant material, the luminescent dopant layer consisting essentially of a second luminescent dopant material and being thinner than the mixed light-emitting layer.

Another aspect of the present invention may be an organic electroluminescent panel including a substrate and the organic electroluminescent element provided on the substrate.

Advantageous Effects of Invention

Since including, as a thin film, a luminescent dopant layer consisting essentially of a luminescent dopant material in the vicinity of a mixed light-emitting layer containing both a luminescent host material and a luminescent dopant material, the organic EL element of the present invention is more likely to restrain generation of barriers to the carriers at the interfaces of the layers than a structure in which multiple mixed light-emitting layers are stacked. Further, a region for recombination of carriers can be made thin. This enables the luminescent dopant materials in the mixed light-emitting layer and the luminescent dopant layer to emit light efficiently, resulting in high luminous efficacy.

Further, the luminescent dopant layer can be formed by vapor-depositing a luminescent dopant material alone in a short time, for example. Thus, the organic EL element of the present invention has higher productivity than conventional structures in which multiple mixed light-emitting layers are stacked.

In addition, the organic EL panel of the present invention includes an organic EL element that achieves both high luminous efficacy and high productivity, and thus can achieve devices such as display devices and lighting devices excellent in productivity and having low power consumption and high luminance.

DESCRIPTION OF EMBODIMENTS

Figure 1:
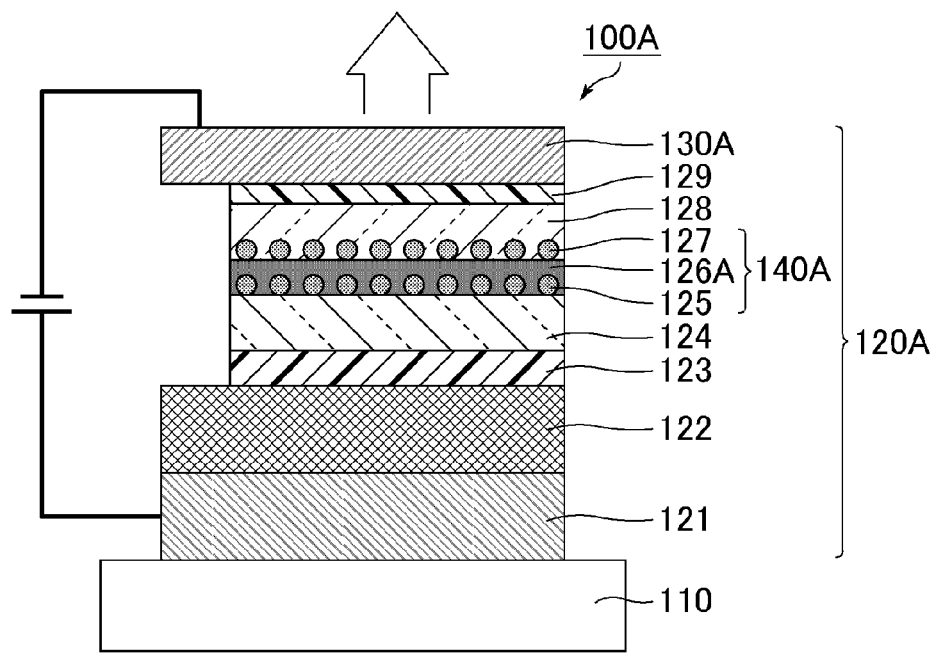
FIG. 1 is a schematic cross-sectional view of an organic EL panel of Example 1.

The organic electroluminescence herein is also referred to as "organic EL". The organic EL element is also generally called an organic light emitting diode (OLED).

The present invention will be mentioned in more detail referring to the drawings in the following examples, but is not limited to these examples. The configurations of the examples may be employed in appropriate combination as long as the combination is not beyond the spirit of the present invention.

Example 1

An organic EL panel of Example 1 is provided with an organic EL element including, in the given order from the substrate side, an anode, a hole-injection layer, a hole-transport layer, a luminescent unit, an electron-transport layer, an electron-injection layer, and a cathode. The luminescent unit includes a mixed light-emitting layer and luminescent dopant layers disposed on the respective sides of the mixed light-emitting layer. In the description, the luminescent dopant layer on the hole-transport layer side is referred to as a "first luminescent dopant layer" and the luminescent dopant layer on the electron-transport layer side is referred to as a "second luminescent dopant layer", and the simple term "luminescent dopant layers" refer to both of the layers. As mentioned above, the luminescent unit has a structure in which the first luminescent dopant layer, the mixed light-emitting layer, and the second luminescent dopant layer are stacked in the given order from the hole-transport layer side.

FIG. 1 is a schematic cross-sectional view of the organic EL panel of Example 1. In an organic EL panel 100A shown in FIG. 1, an organic EL element 120A disposed on a substrate 110 has a structure in which a reflective electrode 121, an anode 122, a hole-injection layer 123, a hole-transport layer 124, a first luminescent dopant layer 125, a mixed light-emitting layer 126A, a second luminescent dopant layer 127, an electron-transport layer 128, an electron-injection layer 129, and a cathode 130A are stacked in the given order from the substrate 110 side. The first luminescent dopant layer 125, the mixed light-emitting layer 126A, and the second luminescent dopant layer 127 constitute a luminescent unit 140A.

The substrate 110 may be a glass substrate, a plastic substrate, or the like. If the substrate 110 is a bendable plastic substrate, a flexible organic EL panel can be provided. Although not illustrated in FIG. 1, the substrate 110 is provided with thin film transistors. The thin film transistors are electrically connected with the reflective electrode 121, and thus control the driving of the organic EL element 120A.

In the organic EL panel 100A of the present example, the reflective electrode 121 disposed below the anode 122 has light reflectivity and the transparent cathode 130A has light transmissivity. In other words, the organic EL element 120A of the present example is a top emission element that emits light from the cathode 130A side. The arrow in FIG. 1 indicates the direction of light emitted from the organic EL element 120A.

The material of the reflective electrode 121 was silver (Ag). The reflective electrode 121 may be an electrode having light reflectivity. Instead of the above one, an aluminum (Al) layer or an indium (In) layer may be used, for example. The reflective electrode 121 had a thickness of 100 nm.

The material of the anode 122 was indium tin oxide (ITO). The anode 122 had a thickness of 50 nm.

The hole-injection layer 123 was made from dipyrazino [2,3-f:2',3'-h]quinoxaline-2,3,6,7,10,11-hexacarbonitrile (HAT-CN). The material of the hole-injection layer 123 may be a hole-injection material similar to that used in usual organic EL elements. The hole-injection layer 123 had a thickness of 10 nm.

The material of the hole-transport layer 124 was 4,4'-bis [N-(1-naphthyl)-N-phenyl-amino]-biphenyl (α-NPD). α-NPD has a hole mobility $\mu h$ of $10^{-3}$ to $10^{-4}$ cm$^2$/Vsec and a LUMO of about −2.4 eV. The material of the hole-transport layer 124 may be a hole-transport material similar to that used in usual organic EL elements, and is preferably a material having a lowest unoccupied molecular orbital (LUMO) level that is 0.1 eV or more higher than that of all the materials contained in the first luminescent dopant layer 125 and the mixed light-emitting layer 126A. The hole-transport layer 124 had a thickness of 20 nm.

The first luminescent dopant layer 125 consists essentially of a luminescent dopant material (second luminescent dopant material). In other words, the concentration of the second luminescent dopant material in the first luminescent dopant layer 125 is 100 wt % or substantially 100 wt %. Here, the phrase "the concentration of the luminescent dopant material in the luminescent dopant layer is substantially 100 wt %" means that the luminescent dopant layer contains no material that affects the characteristics of the layer other than the luminescent dopant material. The layer may contain a slight amount of impurities other than the luminescent dopant material, but the concentration of the luminescent host material is preferably less than 3 wt %.

The second luminescent dopant material in the first luminescent dopant layer 125 may be either a fluorescent dopant material or a phosphorescent dopant material. In the present example, the luminescent dopant material was tris(2-phenylpyridinato)iridium(III) (Ir(ppy)3). The first luminescent dopant layer 125 may contain one second luminescent dopant material or two or more second luminescent dopant materials. Still, the layer preferably contains one second luminescent dopant material.

The first luminescent dopant layer 125 is thinner than the mixed light-emitting layer 126A and is formed in an island-like pattern. In other words, there are portions where the hole-transport layer 124 and the mixed light-emitting layer 126A are in direct contact with each other. The luminescent dopant layer can be formed in an island-like pattern only by shortening the vapor-deposition time. Specifically, vapor deposition of an ultrathin film having a maximum film thickness of 1 nm or smaller provides a film in an island-like pattern. The thickness of the thickest portion of the first luminescent dopant layer 125 (maximum film thickness) was 0.2 nm. The lower limit of the maximum film thickness of the first luminescent dopant layer 125 is preferably 0.1 nm and the upper limit thereof is preferably 1 nm, more preferably 0.5 nm.

The first luminescent dopant layer 125 can be formed by vapor-depositing the second luminescent dopant material.

Formation of the first luminescent dopant layer 125 in an island-like pattern with the concentration of the second luminescent dopant material being 100 wt % or substantially 100 wt % enables prevention of (1) concentration quenching and the resulting decrease in luminous efficacy and (2) inhibition of carrier transfer, an increase in driving voltage, and a decrease in luminous efficacy.

The mixed light-emitting layer 126A is a layer containing at least one luminescent host material (first luminescent host material) and at least one luminescent dopant material (first luminescent dopant material). The mixture layer used in the present example contained 4,4'-N,N'-dicarbazole-biphenyl (CBP) that is one of phosphorescent materials having high hole transportability as a first luminescent host material and Ir(pic)3 as a first luminescent dopant material. CBP has a hole mobility $\mu h$ of $10^{-3}$ to $10^{-6}$ cm$^2$/Vsec, an electron mobility $\mu e$ of $10^{-8}$ to $10^{-10}$ cm$^2$/Vsec, a LUMO of about −2.6 eV, and a HOMO of about −5.3 eV. The weight ratio between CBP and Ir(pic)3 was 0.9:0.1.

The mixed light-emitting layer 126A preferably has bipolar characteristics, i.e., electron transportability and hole transportability at similar levels. The first luminescent host material preferably satisfies a relation between the hole mobility $\mu h$ and the electron mobility $\mu e$ of $0.01 < \mu e/\mu h < 100$, more preferably $0.1 < \mu e/\mu h < 10$. For example, if the first luminescent host material contains multiple luminescent host materials, the maximum hole mobility $\mu h$ and the maximum electron mobility $\mu e$ selected from the hole mobilities $\mu h$ and the electron mobilities $\mu e$ of the respective luminescent host materials preferably satisfy the above relation. The hole mobility $\mu h$ and the electron mobility $\mu e$ can be determined by the time-of-flight method, for example, and may specifically be determined using a photoexcitation carrier mobility measurement device (Sumitomo Heavy Industries, Ltd., trade name: TOF-401). The first luminescent host material may be a mixture of an electron-transportable material and a hole-transportable material.

The first luminescent dopant material may be either a fluorescent dopant material or a phosphorescent dopant material.

The mixed light-emitting layer 126A had a thickness of 5 nm. The lower limit of the film thickness of the mixed light-emitting layer 126A is preferably 2 nm, and the upper limit thereof is preferably 10 nm, more preferably 5 nm.

The mixed light-emitting layer 126A can be formed by co-vapor-depositing the first luminescent host material and the first luminescent dopant material.

The second luminescent dopant layer 127 consists essentially of a luminescent dopant material (second luminescent dopant material). In other words, the concentration of the second luminescent dopant material in the second luminescent dopant layer 127 is 100 wt % or substantially 100 wt %.

The second luminescent dopant material in the second luminescent dopant layer 127 may be either a fluorescent dopant material or a phosphorescent dopant material. In the present example, [bis(3,5-difluoro-2-(2-pyridylphenyl-(2-carboxypyridyl)iridium(III)] (FIrpic) was used. The second luminescent dopant layer 127 may contain one second luminescent dopant material or two or more second luminescent dopant materials. Still, the layer preferably contains one second luminescent dopant material. The second luminescent dopant material in the second luminescent dopant layer 127 may be the same as the second luminescent dopant material in the first luminescent dopant layer 125. Still, the second luminescent dopant material in the first luminescent dopant layer 125 and the second luminescent dopant material in the second luminescent dopant layer 127 are preferably different materials.

The second luminescent dopant layer 127 is thinner than the mixed light-emitting layer 126A and is formed in an island-like pattern. In other words, there are portions where the electron-transport layer 128 and the mixed light-emitting layer 126A are in direct contact with each other. The thickness of the thickest portion of the second luminescent dopant layer 127 (maximum film thickness) was 0.2 nm. The lower limit of the maximum film thickness of the second luminescent dopant layer 127 is preferably 0.1 nm, and the upper limit thereof is preferably 1 nm, more preferably 0.5 nm.

The second luminescent dopant layer 127 can be formed by vapor-depositing the second luminescent dopant material.

The first luminescent dopant material in the mixed light-emitting layer 126A and the second luminescent dopant materials in the first luminescent dopant layer 125 and the second luminescent dopant layer 127 are preferably selected such that the layers can emit light of three different primary colors, and any combination may be appropriate.

The material of the electron-transport layer 128 was bathophenanthroline (Bphen). The material of the electron-transport layer 128 may be the same as the electron-transport material used in usual organic EL elements. Still, a material suitably used has a highest occupied molecular orbital (HOMO) level that is 0.1 eV or more lower than that of all the materials contained in the mixed light-emitting layer 126A and the second luminescent dopant layer 127. Bphen has an electron mobility μe of $10^{-4}$ to $10^{-5}$ cm$^2$/Vsec and a HOMO of about −6.3 eV. The electron-transport layer 128 had a thickness of 30 nm.

The material of the electron-injection layer 129 was lithium fluoride (LiF). The material of the electron-injection layer 129 may be the same as the electron injection material used in usual organic EL elements. The electron-injection layer 129 had a thickness of 1 nm.

The cathode 130A was a layer containing Ag and magnesium (Mg). The weight ratio between Ag and Mg was 0.9:0.1. The material of the cathode 130A may be a material having light transmissivity and conductivity. Instead of the above, ITO or indium zinc oxide (IZO) may be used. The cathode 130A had a thickness of 20 nm.

In the present example, the luminescent unit 140A has the following characteristics.

The unit includes only one mixed light-emitting layer 126A formed by co-vapor-depositing a luminescent host material and a luminescent dopant material. Instead of stacking multiple mixed light-emitting layers, luminescent dopant layers (first luminescent dopant layer 125 and second luminescent dopant layer 127) consisting essentially of a luminescent dopant material are provided.

The mixed light-emitting layer 126A is a thin film and has bipolar characteristics.

The first luminescent dopant layer 125 and the second luminescent dopant layer 127 are ultrathin films in an island-like pattern.

The hole-transport layer 124 has a high LUMO level and the electron-transport layer 128 has a low HOMO level, so that the layers block carriers from breaking out of the luminescent unit 140A and improve the luminous efficacy.

Since having the above characteristics, the luminescent unit 140A of the present example includes no barriers at the interfaces of the layers containing the luminescent host materials, and thus is less likely to cause barriers against carriers at the interfaces of the layers, in comparison with conventional luminescent units in which three mixed light-emitting layers are stacked. Further, the luminescent unit 140A has a small thickness. This is why the carriers easily spread over all of the three layers, i.e., the first luminescent dopant layer 125, the mixed light-emitting layer 126A, and the second luminescent dopant layer 127, and the whole three layers can be utilized as a region for recombination of carriers. As a result, all of three luminescent dopant materials contained in the three layers can emit light efficiently, resulting in high luminous efficacy. If the anode is patterned so as to have different thicknesses corresponding to pixels, the pixels can emit light of the respective colors. Therefore, a device capable of displaying a white screen can be achieved by a simple structure without multiple light-emitting layers and intermediate layers therebetween.

Example 2

Example 1 relates to a top emission organic EL panel. Still, the configuration of the present invention can be applied to bottom emission organic EL panels. Example 2 relates to a bottom emission organic EL panel having a configuration similar to that of the organic EL panel of Example 1 except for the structure of a pair of electrodes.

Figure 2:
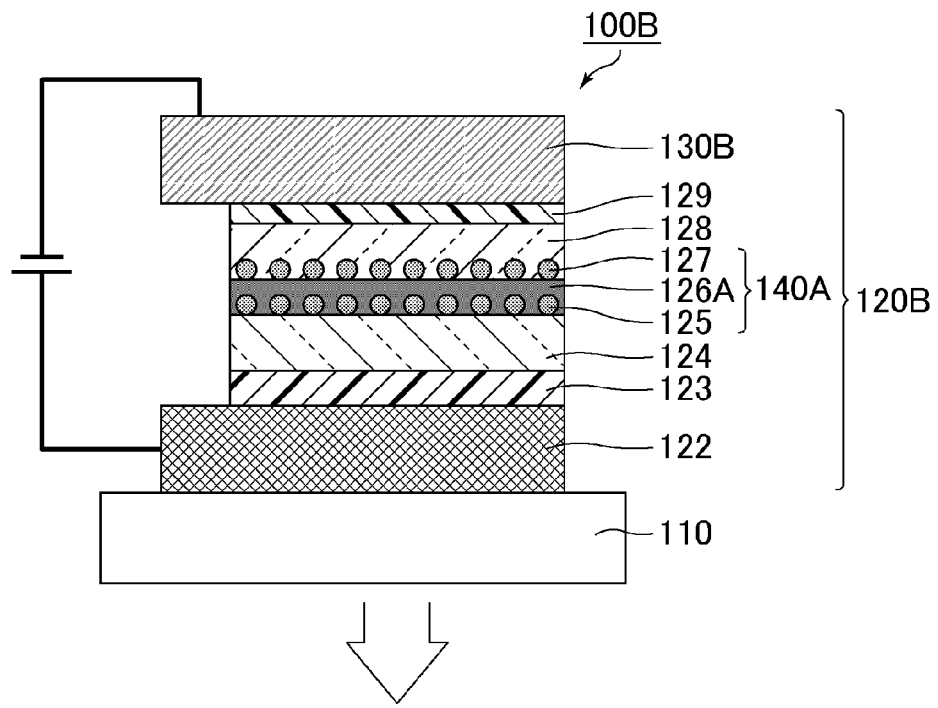
FIG. 2 is a schematic cross-sectional view of an organic EL panel of Example 2.

FIG. 2 is a schematic cross-sectional view of the organic EL panel of Example 2. In an organic EL panel 100B shown in FIG. 2, an organic EL element 120B disposed on the substrate 110 has a structure in which the anode 122, the hole-injection layer 123, the hole-transport layer 124, the first luminescent dopant layer 125, the mixed light-emitting layer 126A, the second luminescent dopant layer 127, the electron-transport layer 128, the electron-injection layer 129, and the cathode 130B are stacked in the given order from the substrate 110 side. The arrow in FIG. 2 indicates the direction of light emitted from the organic EL element 120B.

In the present example, the material of the anode 122 was ITO. The anode 122 had a thickness of 100 nm.

In the present example, the material of the cathode 130B was aluminum (Al). The cathode 130B had a thickness of 100 nm.

The present example, like Example 1, also allows a region for recombination of carriers to spread over the whole three layers, i.e., the first luminescent dopant layer 125, the mixed light-emitting layer 126A, and the second luminescent dopant layer 127, and thus enables production of a device capable of causing the three luminescent dopant materials contained in the three layers to emit light efficiently and of displaying a white screen.

Example 3

In Example 1, the first luminescent host material in the mixed light-emitting layer 126A was CBP having high hole transportability. Still, in the present invention, the mixed light-emitting layer may contain two or more luminescent host materials. Example 3 has the configuration similar to that of the organic EL panel of Example 1 except that the first luminescent host material was a mixture of CBP having high hole transportability and 2,2',2"-(1,3,5-Benzinetriyl)-tris(1-phenyl-1-H-benzimidazole (TPBI) having high electron transportability at a weight ratio of 1:1.

Figure 3:
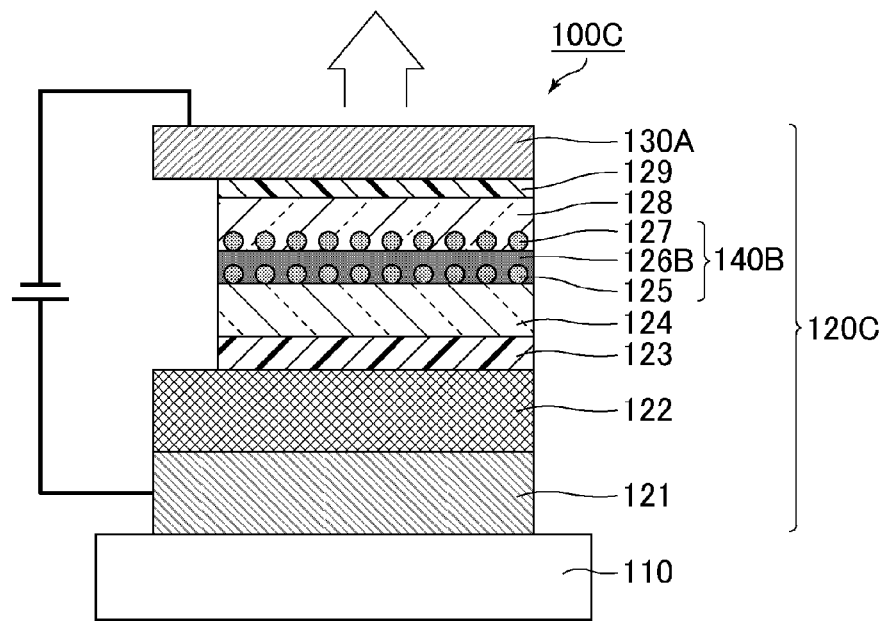
FIG. 3 is a schematic cross-sectional view of an organic EL panel of Example 3.

FIG. 3 is a schematic cross-sectional view of the organic EL panel of Example 3. In an organic EL panel 100C shown in FIG. 3, an organic EL element 120C disposed on the substrate 110 has a structure in which the reflective electrode 121, the anode 122, the hole-injection layer 123, the hole-transport layer 124, the first luminescent dopant layer 125, a mixed light-emitting layer 126B, the second luminescent dopant layer 127, the electron-transport layer 128, the electron-injection layer 129, and the cathode 130A are stacked in the given order from the substrate 110 side. The first luminescent dopant layer 125, the mixed light-emitting layer 126B, and the second luminescent dopant layer 127 constitute a luminescent unit 140B. The arrow in FIG. 3 indicates the direction of light emitted from the organic EL element 120C.

In the present example, the mixed light-emitting layer 126B was a mixture layer containing CBP having high hole transportability and TPBI having high electron transportability as first luminescent host materials and Ir(pic)3 as a first luminescent dopant material. TPBI has an electron mobility $\mu e$ of about $10^{-5}$ to $10^{-6}$ cm$^2$/Vsec, a LUMO of about −2.8 eV, and a HOMO of about −5.7 eV. The weight ratio among CBP, TPBI, and Ir(pic)3 was 0.45:0.45:0.1. The mixed light-emitting layer 126B had a thickness of 5 nm.

The present example, like Example 1, also allows a region for recombination of carriers to spread over the whole three layers, i.e., the first luminescent dopant layer 125, the mixed light-emitting layer 126B, and the second luminescent dopant layer 127, and thus enables production of a device capable of causing the three luminescent dopant materials contained in the three layers to emit light efficiently and of displaying a white screen. Further, the bipolar characteristics of the mixed light-emitting layer 126B are better than the mixed light-emitting layer 126A. Thus, a higher efficiency can be achieved.

Example 4

In Example 1, the first luminescent dopant layer 125 and the second luminescent dopant layer 127 are disposed on the respective sides of the mixed light-emitting layer 126A. In the present invention, the luminescent dopant layer may be disposed only on one side of the mixed light-emitting layer. Example 4 has the configuration similar to that of the organic EL panel of Example 1 except that the luminescent unit 140A including the first luminescent dopant layer 125, the mixed light-emitting layer 126A, and the second luminescent dopant layer 127 is replaced by a luminescent unit which includes no first luminescent dopant layer and in which the material of the mixed light-emitting layer is changed.

Figure 4:
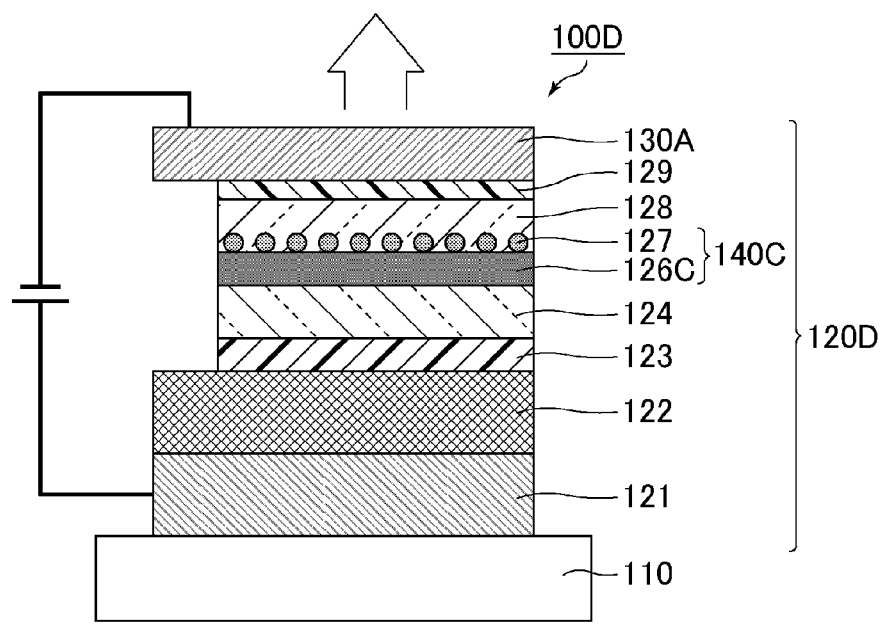
FIG. 4 is a schematic cross-sectional view of an organic EL panel of Example 4.

FIG. 4 is a schematic cross-sectional view of the organic EL panel of Example 4. In an organic EL panel 100D shown in FIG. 4, an organic EL element 120D disposed on the substrate 110 has a structure in which the reflective electrode 121, the anode 122, the hole-injection layer 123, the hole-transport layer 124, a mixed light-emitting layer 126C, the second luminescent dopant layer 127, the electron-transport layer 128, the electron-injection layer 129, and the cathode 130A are stacked in the given order from the substrate 110 side. The mixed light-emitting layer 126C and the second luminescent dopant layer 127 constitute a luminescent unit 140C. The arrow in FIG. 4 indicates the direction of light emitted from the organic EL element 120D.

In the present example, the mixed light-emitting layer 126C was a mixture layer containing CBP having high hole transportability as a first luminescent host material and Ir(bzq)3 as a first luminescent dopant material. The weight ratio between CBP and Ir(bzq)3 was 0.9:0.1. The mixed light-emitting layer 126C had a thickness of 5 nm.

In the present example, the first luminescent dopant layer 125 is not provided. Still, use of a material that emits light of yellow, a secondary color, for the mixed light-emitting layer 126C and the resulting combination with the second luminescent dopant layer 127 that emits blue light enables production of a device capable of displaying a white screen. Such a configuration is advantageous in that the first luminescent dopant layer 125 can be omitted and thus the structure can be simplified. In contrast, the single color reproducibility may be insufficient in display applications. Thus, the configuration is particularly suitable for lighting applications. Also, the present invention allows a region for recombination of carriers to spread over the whole two layers, i.e., the mixed light-emitting layer 126C and the second luminescent dopant layer 127, and thus causes both of the two luminescent dopant materials contained in the two layers to emit light efficiently.

Example 5

Example 5 has the configuration similar to that of the organic EL panel of Example 1 except that a block layer containing the first luminescent host material is disposed between the mixed light-emitting layer 126A and the second luminescent dopant layer 127.

Figure 5:
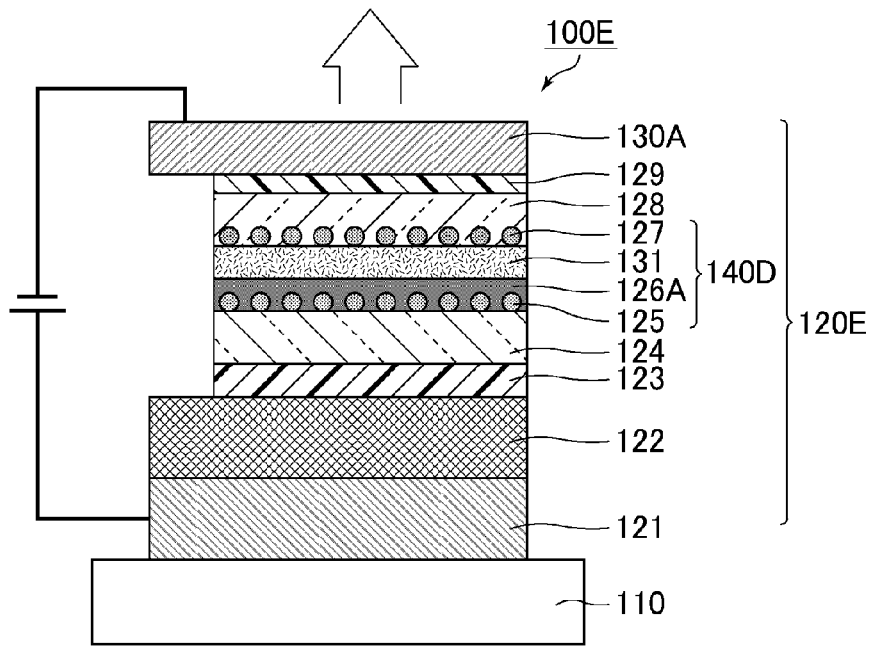
FIG. 5 is a schematic cross-sectional view of an organic EL panel of Example 5.

FIG. 5 is a schematic cross-sectional view of the organic EL panel of Example 5. In an organic EL panel 100E shown in FIG. 5, an organic EL element 120E disposed on the substrate 110 has a structure in which the reflective electrode 121, the anode 122, the hole-injection layer 123, the hole-transport layer 124, the first luminescent dopant layer 125, the mixed light-emitting layer 126A, a block layer 131, the second luminescent dopant layer 127, the electron-transport layer 128, the electron-injection layer 129, and the cathode 130A are stacked in the given order from the substrate 110 side. The first luminescent dopant layer 125, the mixed light-emitting layer 126A, the block layer 131, and the second luminescent dopant layer 127 constitute a luminescent unit 140D. The arrow in FIG. 5 indicates the direction of light emitted from the organic EL element 120E.

Some luminescent dopant materials may be deactivated by the interaction between excitons generated in the mixed light-emitting layer and excitons generated in the luminescent dopant layer, resulting in a decrease in luminous efficacy. Thus, in the present example, the block layer 131 is disposed between the mixed light-emitting layer 126A and the second luminescent dopant layer 127 so as to prevent the first luminescent dopant material in the mixed light-emitting layer 126A and the second luminescent dopant material in the second luminescent dopant layer 127 from being in contact with each other. This prevents the deactivation due to the interaction between the excitons and further improves the luminous efficacy.

The material of the block layer 131 may be any material that can transport both carriers, i.e., electrons and holes. Examples thereof include hole-transport materials such as TPD and TCTA and electron-transport materials such as Alq$_3$ and BCP. In order to easily excite the dopant material, luminescent host materials are suitably used. The luminescent host material used in the block layer 131 may be the first luminescent host material contained in the mixed light-emitting layer 126A or a luminescent host material (second luminescent host material) not contained in the mixed light-emitting layer 126A, or the first luminescent host material and the second luminescent host material may be used in combination. In the present example, the material of the block layer 131 was CBP which corresponds to the first luminescent host material.

The material of the block layer 131 preferably satisfies a relation between the hole mobility $\mu h$ and the electron mobility μe of 0.01<μe/μh<100, more preferably 0.1<μe/μh<10. For example, if the block layer 131 contains both the first luminescent host material and the second luminescent host material, the maximum hole mobility μh and the maximum electron mobility μe selected from the hole mobilities μh and the electron mobilities μe of the first and second luminescent host materials preferably satisfy the above relation. If the material of the block layer 131 contains the second luminescent host material alone, the second luminescent host material is preferably one satisfying a relation between the hole mobility μh and the electron mobility μe of 0.01<μe/μh<100, more preferably 0.1<μe/μh<10. The block layer 131 had a thickness of 5 nm.

In the present example, the material of the electron-transport layer 128 preferably has a HOMO level that is 0.1 eV or more lower than that of all the materials contained in the mixed light-emitting layer 126A and the second luminescent dopant layer 127 and all the materials contained in the block layer 131.

The present example, like Example 1, also allows a region for recombination of carriers to spread over the whole three layers, i.e., the first luminescent dopant layer 125, the mixed light-emitting layer 126B, and the second luminescent dopant layer 127, and thus enables production of a device capable of causing the three luminescent dopant materials contained in the three layers to emit light efficiently and of displaying a white screen.

In the present example, the block layer 131 was disposed only on the electron-transport layer 128 side of the mixed light-emitting layer 126A. In contrast, the block layer 131 may be disposed only on the hole-transport layer 124 side of the mixed light-emitting layer 126A or may be disposed on both the electron-transport layer 128 side and the hole-transport layer 124 side of the mixed light-emitting layer 126A. If the block layer 131 is disposed on the hole-transport layer 124 side, the material of the hole-transport layer 124 preferably has a LUMO level that is 0.1 eV or more higher than that of all the materials contained in the first luminescent dopant layer 125 and the mixed light-emitting layer 126A and all the materials contained in the block layer 131.

Example 6

Example 6 describes the principle of displaying a white screen. Example 6 has a configuration similar to that of the organic EL panel of Example 1 except for the structure of the anode.

Figure 6:
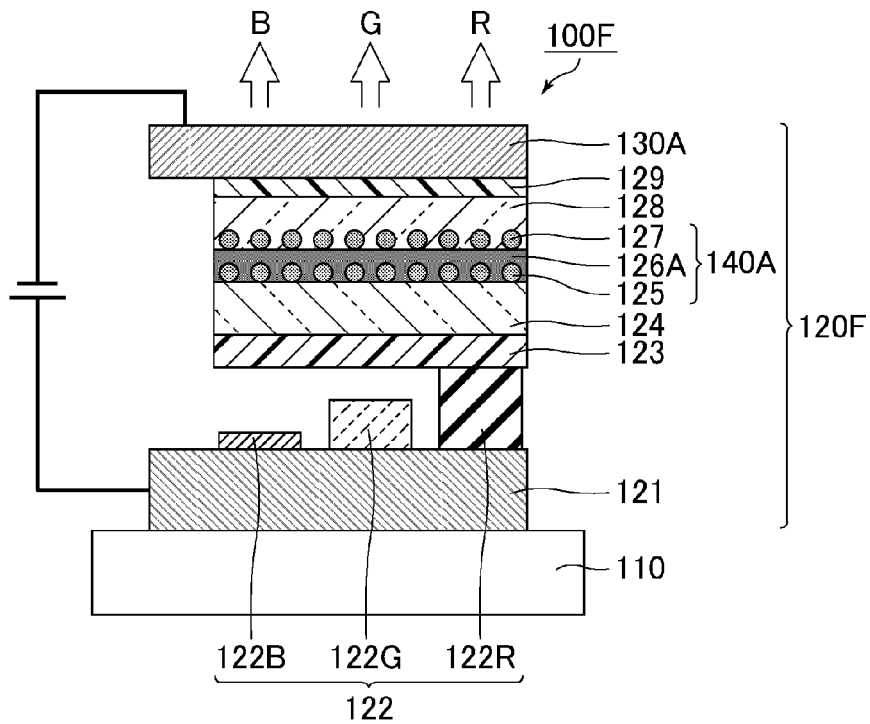
FIG. 6 is a schematic cross-sectional view of an organic EL panel of Example 6.
Figure 7:
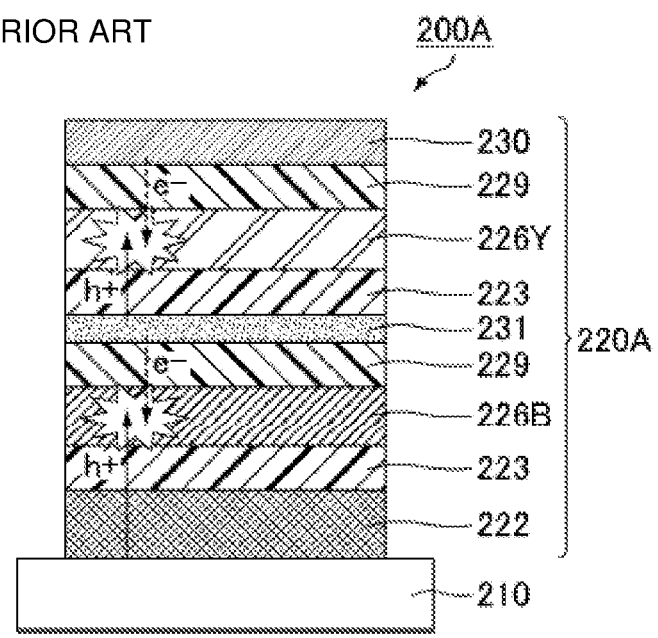
FIG. 7 is a schematic cross-sectional view of one example of an organic EL panel having a conventional tandem structure.
Figure 8:
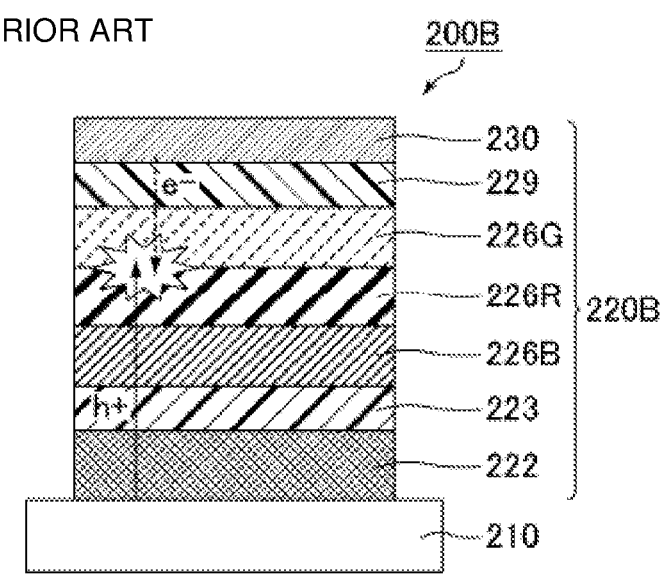
FIG. 8 is a schematic cross-sectional view of one example of an organic EL panel having a conventional structure in which light-emitting layers of different colors are stacked.

FIG. 6 is a schematic cross-sectional view of an organic EL panel of Example 6. In an organic EL panel 100F shown in FIG. 6, an organic EL element 120F disposed on the substrate 110 has a structure in which the reflective electrode 121, the anodes 122, the hole-injection layer 123, the hole-transport layer 124, the first luminescent dopant layer 125, the mixed light-emitting layer 126A, the second luminescent dopant layer 127, the electron-transport layer 128, the electron-injection layer 129, and the cathode 130A are stacked in the given order from the substrate 110 side. The anodes 122 are provided for the respective pixels and include blue pixel anodes 122B, green pixel anodes 122G, and red pixel anodes 122R. The arrows in FIG. 6 indicate the directions of light of three primary colors, i.e., RGB, emitted from the organic EL element 120F.

Each blue pixel anode 122B is formed of a 20-nm-thick ITO film, each green pixel anode 122G is formed of a 60-nm-thick ITO film, and each red pixel anode 122R is formed of a 100-nm-thick ITO film. In the organic EL panel of Example 6, the anodes 122 have different thicknesses for the respective pixels. Thus, different optical interferences occur in the respective pixels, so that the pixels can emit light of different colors. In display applications, various colors are displayed by combination of the three primary colors, i.e., RGB. Thus, the configuration of Example 6 is suitable for display applications. Here, the anodes 122 with different thicknesses for the respective pixels can be formed even without a high-resolution vapor-deposition mask.

[Additional Remarks]

The following gives examples of preferred embodiments of the organic EL element of the present invention. The examples may be employed in appropriate combination as long as the combination is not beyond the spirit of the present invention.

The luminescent dopant layer may have a thickness of 1 nm or smaller. This enables formation of the luminescent dopant layer in an island-like pattern and allows the carriers to spread over the whole luminescent unit. Thereby, light can be efficiently emitted.

The first luminescent host material may satisfy a relation between the hole mobility μh and the electron mobility μe of 0.01<μe/μh<100. Such improvement of the bipolar characteristics of the luminescent host material enables much higher efficiency.

The luminescent dopant layer may include a first luminescent dopant layer positioned between the hole-transport layer and the mixed light-emitting layer, and the material constituting the hole-transport layer may have a lowest unoccupied molecular orbital energy level that is 0.1 eV or more higher than that of all the materials contained in the mixed light-emitting layer and the first luminescent dopant layer. This restrains transfer of electrons (carriers), which are injected from the electron-transport layer side into the mixed light-emitting layer, toward the hole-transport layer side, preventing a decrease in luminous efficacy.

The luminescent dopant layer may include a second luminescent dopant layer positioned between the electron-transport layer and the mixed light-emitting layer, and the material constituting the electron-transport layer may have a highest occupied molecular orbital energy level that is 0.1 eV or more lower than that of all the materials contained in the mixed light-emitting layer and the second luminescent dopant layer. This restrains transfer of holes (carriers), which are injected from the hole-transport layer side into the mixed light-emitting layer, toward the electron-transport layer side, preventing a decrease in luminous efficacy.

The luminescent unit may include a block layer between the mixed light-emitting layer and the luminescent dopant layer, and the block layer may contain a material capable of transporting both carriers which are electrons and holes. This prevents deactivation and the resulting decrease in luminous efficacy due to the interaction between excitons generated in the mixed light-emitting layer and excitons generated in the luminescent dopant layer. Thereby, the luminous efficacy can be further improved.

A material of the block layer may satisfy a relation between the hole mobility μh and the electron mobility μe of 0.01<μe/μh<100. Such improvement of the bipolar characteristics of the second luminescent host material enables much higher efficiency.

The luminescent unit may include, from the hole-transport layer side, a first luminescent dopant layer serving as the luminescent dopant layer, a first block layer serving as the block layer, and the mixed light-emitting layer, and a material constituting the hole-transport layer may have a lowest unoccupied molecular orbital energy level that is 0.1 eV or more higher than that of all the materials contained in the mixed light-emitting layer, the first block layer, and the first luminescent dopant layer. This restrains transfer of electrons (carriers), which are injected from the electron-transport layer side into the mixed light-emitting layer, toward the hole-transport layer side, preventing a decrease in luminous efficacy.

The luminescent unit may include, from the electron-transport layer side, a second luminescent dopant layer serving as the luminescent dopant layer, a second block layer serving as the block layer, and the mixed light-emitting layer, and a material constituting the electron-transport layer may have a highest occupied molecular orbital energy level that is 0.1 eV or more lower than that of all the materials contained in the mixed light-emitting layer, the second block layer, and the second luminescent dopant layer. This restrains transfer of holes (carriers), which are injected from the hole-transport layer side into the mixed light-emitting layer, toward the electron-transport layer side, preventing a decrease in luminous efficacy.

REFERENCE SIGNS LIST 100A, 100B, 100C, 100D, 100E, 100F, 200A, 200B: organic EL panel
110, 210: substrate
120A, 120B, 120C, 120D, 120E, 120F, 220A, 220B: organic EL element
121: reflective electrode
122, 222: anode
122B: blue pixel anode
122G: green pixel anode
122R: red pixel anode
123, 223: hole-injection layer
124: hole-transport layer
125: first luminescent dopant layer
126A, 126B, 126C: mixed light-emitting layer
127: second luminescent dopant layer
128: electron-transport layer
129, 229: electron-injection layer
130A, 130B, 230: cathode
131: block layer
140A, 140B, 140C, 140D: luminescent unit
226B: blue light-emitting layer
226G: green light-emitting layer
226R: red light-emitting layer
226Y: yellow light-emitting layer
231: intermediate layer

The invention claimed is:

1. An organic electroluminescent element comprising, in the given order:
an anode;
a hole-transport layer;
a luminescent unit;
an electron-transport layer; and
a cathode, wherein
the luminescent unit includes a mixed light-emitting layer, a first luminescent dopant layer between the hole-transport layer and the mixed light-emitting layer, and a second luminescent dopant layer between the electron-transport layer and the mixed light-emitting layer,
the mixed light-emitting layer includes a first luminescent host material and a first luminescent dopant material, and
the first luminescent dopant layer and the second luminescent dopant layer consist essentially of a second luminescent dopant material and are thinner than the mixed light-emitting layer.

2. The organic electroluminescent element according to claim 1, wherein the first luminescent dopant layer and the second luminescent dopant layer have thicknesses of 1 nm or smaller.

3. The organic electroluminescent element according to claim 1, wherein the first luminescent host material satisfies a relation between a hole mobility $\mu h$ and an electron mobility $\mu e$ of $0.01<\mu e/\mu h<100$.

4. The organic electroluminescent element according to claim 1, wherein
a material defining the hole-transport layer has a lowest unoccupied molecular orbital energy level that is 0.1 eV or more higher than that of all the materials contained in the mixed light-emitting layer and the first luminescent dopant layer.

5. The organic electroluminescent element according to claim 1, wherein
a material defining the electron-transport layer has a highest occupied molecular orbital energy level that is 0.1 eV or more lower than that of all the materials contained in the mixed light-emitting layer and the second luminescent dopant layer.

6. The organic electroluminescent element according to claim 1, wherein
the luminescent unit includes a block layer between the mixed light-emitting layer and the first luminescent dopant layer or the second luminescent dopant layer, and
the block layer contains a material capable of transporting both carriers which are electrons and holes.

7. The organic electroluminescent element according to claim 6, wherein the material of the block layer satisfies a relation between a hole mobility $\mu h$ and an electron mobility $\mu e$ of $0.01<\mu e/\mu h<100$.

8. The organic electroluminescent element according to claim 6, wherein
the luminescent unit includes, from the hole-transport layer side, the first luminescent dopant layer, a first block layer serving as the block layer, and the mixed light-emitting layer, and
a material defining the hole-transport layer has a lowest unoccupied molecular orbital energy level that is 0.1 eV or more higher than that of all the materials contained in the mixed light-emitting layer, the first block layer, and the first luminescent dopant layer.

9. The organic electroluminescent element according to claim 6, wherein
the luminescent unit includes, from the electron-transport layer side, the second luminescent dopant layer, a second block layer serving as the block layer, and the mixed light-emitting layer, and
a material defining the electron-transport layer has a highest occupied molecular orbital energy level that is 0.1 eV or more lower than that of all the materials contained in the mixed light-emitting layer, the second block layer, and the second luminescent dopant layer.

10. An organic electroluminescent panel comprising a substrate and the organic electroluminescent element according to claim 1 disposed on the substrate.

11. The organic electroluminescent element according to claim 1, wherein
the first luminescent dopant layer includes no material other than the second luminescent dopant material that affects characteristics of the first luminescent dopant layer, and a concentration of luminescent host materials in the first luminescent dopant layer is less than 3 wt %, and the second luminescent dopant layer includes no material other than the second luminescent dopant material that affects characteristics of the second luminescent dopant layer, and a concentration of luminescent host materials in the second luminescent dopant layer is less than 3 wt %.

12. The organic electroluminescent element according to claim 1, wherein the first luminescent dopant layer is located on a boundary between the hole-transport layer and the mixed light-emitting layer.

13. The organic electroluminescent element according to claim 12, wherein the first luminescent dopant layer is defined in an island-shaped pattern and, the hole-transport layer and the mixed light-emitting layer are partially in direct contact with each other.

14. The organic electroluminescent element according to claim 1, wherein the second luminescent dopant layer is located on a boundary between the electron-transport layer and the mixed light-emitting layer.

15. The organic electroluminescent element according to claim 14, wherein the second luminescent dopant layer is defined in an island-shaped pattern, and the electron-transport layer and the mixed light-emitting layer are partially in direct contact with each other.

* * * * *